United States Patent [19]

Besier et al.

[11] Patent Number: 5,519,387

[45] Date of Patent: May 21, 1996

[54] UTILITY METER ASSEMBLY AND REMOTE MODULE AND MOUNTING APPARATUS AND ASSEMBLY

[75] Inventors: Emil Besier, Prospect Heights; Liviu Corsatea, Des Plaines; Stanley Wrzesinski, Arlington Heights, all of Ill.

[73] Assignee: Motorola, Inc., Schaumburg, Ill.

[21] Appl. No.: 227,418

[22] Filed: Apr. 14, 1994

[51] Int. Cl.⁶ .................................................. G08B 23/00
[52] U.S. Cl. ...................... 340/870.02; 340/870.03; 340/870.07; 340/870.11; 342/703; 324/142
[58] Field of Search .................................. 343/702, 701, 343/703, 708; 361/659; 340/870.02, 870.03, 870.07, 870.11; 324/142, 110, 113

[56] References Cited

U.S. PATENT DOCUMENTS

| | | | |
|---|---|---|---|
| 3,197,752 | 7/1965 | Rabinow | 340/870.02 |
| 3,573,628 | 4/1971 | Cramer et al. | 343/702 |
| 4,697,180 | 9/1987 | Swanson | 340/870.02 |
| 4,904,995 | 2/1990 | Benner et al. | 340/870.02 |
| 5,056,107 | 10/1994 | Johnson et al. | 340/870.03 |
| 5,262,792 | 11/1993 | Egashira | 343/702 |
| 5,278,551 | 1/1994 | Wakatsuki et al. | 340/870.02 |

*Primary Examiner*—Brent A. Swarthout
*Assistant Examiner*—Ashok Mannava
*Attorney, Agent, or Firm*—Phillip H. Melamed

[57] ABSTRACT

Utility meter assembly (10) includes a utility meter (11) having an external housing (12) adjacent to which is mounted a remote meter reading module housing (25) that preferably is mounted to a pair of upstanding cylindrical posts (15 and 16) that rise from the utility meter housing (12). Preferably, flexible pins (32), which preferably are part of the module housing (25), bias the module housing (25), and a ground plane plate (26) within the module housing, towards a conductive surface (14) of the utility meter housing (12). The ground plane plate (26) coupled to the meter housing (12) and to the conductive surface (14) takes advantage of the meter as an extended ground plane or a counterpoise and thus increases the radiation efficiency of the antenna. This configuration permits the use of a shorter antenna (23) for power efficient transmission of meter data. Also, the configuration of the module housing (25) provides an improved snap on assembly for mounting a module housing (25) to a pair of posts (15,16).

23 Claims, 4 Drawing Sheets

5,519,387

UTILITY METER ASSEMBLY AND REMOTE MODULE AND MOUNTING APPARATUS AND ASSEMBLY

FIELD OF THE INVENTION

The present invention relates to the field of utility meter assemblies and remote modules and mounting apparatus and assemblies which are usable in connection with utility meters and radio frequency transmitter modules for such meters.

BACKGROUND OF THE INVENTION

Utility meters for measuring utilities, such as electricity, gas and water, are known. Typically the usage of a utility is visually indicated by the meter and periodically, such as once a month, a meter reader person is sent to read the meter and thereby determine the amount of utility usage. In some proposed systems, rather than sending a meter reader to read each individual meter's visual display, the meter reading is transmitted to some central location on a periodic or aperiodic basis along with an ID code identifying the specific utility meter. In that way, the central location can calculate the amount of utility usage without sending a meter reader to each meter's visual display location.

While utility meter reading systems such as those described above are feasible, adding the transmission electronics to a standard utility meter generally involves extensive redesign of the utility meter to incorporate the transmission electronics within the utility meter housing. Also the required antenna size and power source make it impractical and non-economical to provide a system which operates at low frequencies, such as in the VHF band. Thus what is needed is a convenient and economical way of adding meter data transmission electronics, preferably battery operated, electronics to existing utility meters to provide an automated system which does not require a meter reader person to physically visit each meter and view its visual display.

In the field of module housing mounting, typically it is desired to provide such mounting with a minimum amount of effort and a minimum amount of mounting apparatus to thereby minimize the cost of mounting a module housing. Prior module mounting systems have involved the use of screws or clamps or other additional hardware and this additional hardware undesirable adds to the cost of the mounting assembly and the labor involved in mounting a module as part of an assembly. Thus, an improved module mounting apparatus and assembly is desired which minimizes the need for additional mounting apparatus and is economical and involves a minimum of installation labor.

BRIEF DESCRIPTION OF THE DRAWINGS

The present invention can be better understood by reference to the drawings in which.

DESCRIPTION OF THE PREFERRED EMBODIMENTS

Figure 1:
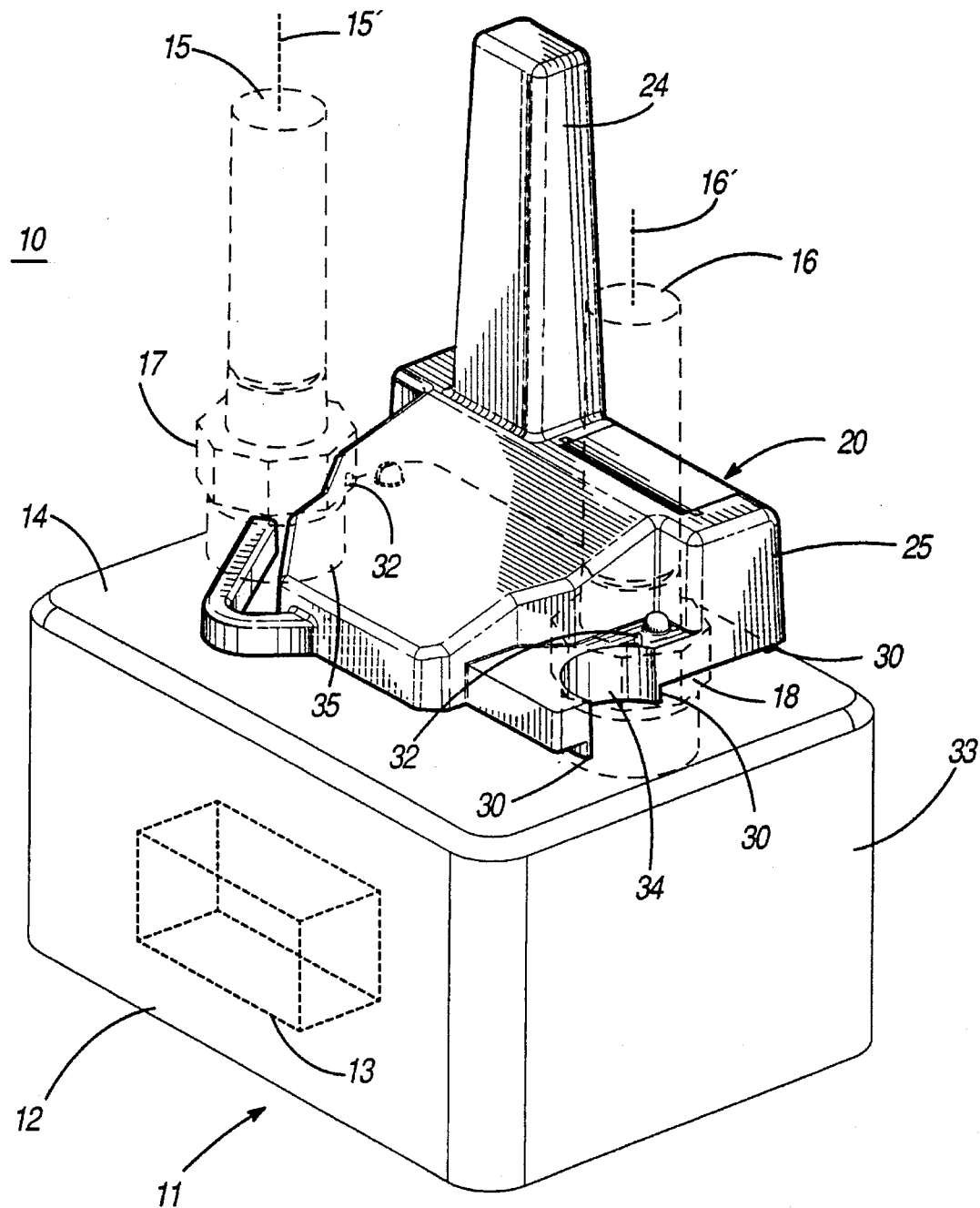
FIG. 1 is a prospective view of a utility meter assembly constructed in accordance with the present invention and utilizing a remote module mounting apparatus/assembly.

Referring to FIG. 1 a utility meter assembly 10 is illustrated. The assembly includes at least one utility meter 11 having an external housing 12 within which is mounted utility measuring apparatus 13 for measuring the use of a utility, such as gas, water or electricity, for example. In FIG. 1 this measuring apparatus is shown in phantom as a box 13 and the details of this measuring apparatus are not significant to the present invention. The apparatus can comprise, for example, a series of meter wheels which are incremented for every use increment of the utility being measured. Preferably the measuring apparatus 13 also includes electronics to convert the utility meter reading into an electronic signal internal to the housing 12.

The utility meter external housing 12 includes at least one conductive metal surface 14 which in FIG. 1 is shown as a planar top surface 14 of utility meter 11. In actuality, the entire external housing 12 is generally formed as a metallic case with surface 14 forming part of this metallic case.

Extending from the external housing 12 are a pair of rigid utility meter mounting posts 15 and 16 each centered about an axis 15' and 16', respectively. The mounting posts are the connections to the inlet pipe and outlet pipe of the utility meter. The mounting posts 15 and 16 are shown in phantom in FIG. 1 so as not to obscure other portions of FIG. 1. Each of the mounting posts 15 and 16 has an annular shoulder or bushing 17 or 18 associated with the mounting posts. The shoulders 17 and 18 are spaced at a predetermined dimension 19 above top metallic surface 14. Preferably, the mounting posts 15 and 16 and their annular shoulders 17 and 18 are metallic in construction. The spacing 19 is best illustrated in the side view FIG. 7 of the utility meter 11.

Figure 7:
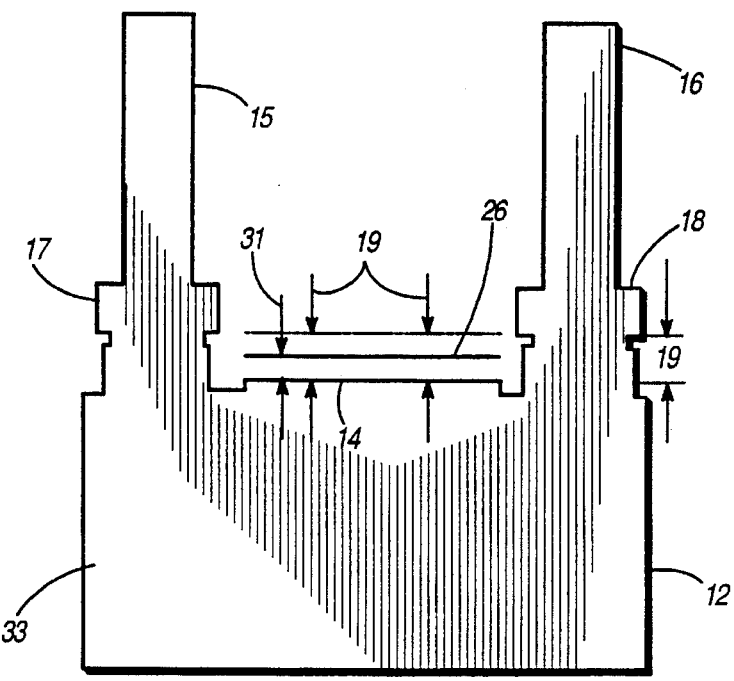
FIG. 7 is a side view of the utility meter and its mounting posts (inlet pipe and outlet pipe connections) shown in FIG. 1.

It is significant to note that the shoulder spacing 19 shown in FIG. 7 can vary for different types of utility meters and it is desired to provide a mounting apparatus for a remote module which can accommodate various different sizes for the dimension 19.

Figure 4:
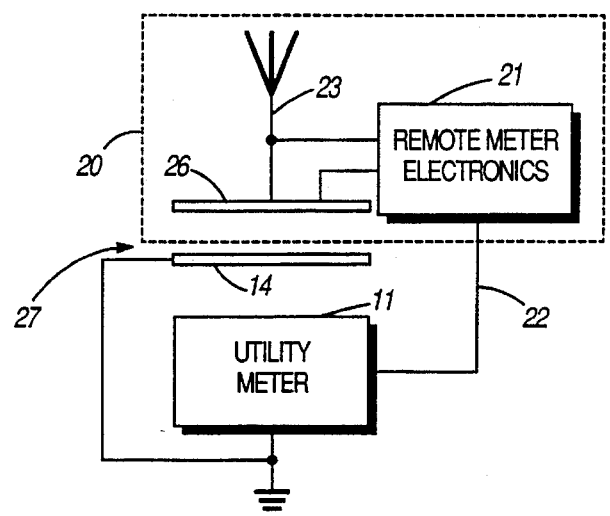
FIG. 4 is an electrical schematic of the utility meter assembly shown in FIG. 1.

Referring again to FIG. 1, a remote meter reading module 20 is illustrated. The module 20 is positioned outside of and mounted adjacent to the external housing 12 of the utility meter 11. The remote meter reading module 20 includes remote meter electronics 21, shown in FIG. 4, which includes transmitter electronics. The remote meter electronics 21 is connected to the utility meter 11 by a cable 22 shown in FIG. 4 but not shown in FIG. 1 for clarity. The remote meter electronics 21 is also connected to the base of an antenna 23 shown in FIG. 4. The antenna 23 is contained within an upstanding projection 24 of a molded plastic remote meter reading module housing 25. The remote meter electronics 21 is also connected to a conductive ground plane plate 26 (best shown in FIG. 5) and also schematically shown as a line in FIG. 7 and as a plate in FIG. 4. The conductive ground plane plate 26 forms one plate of a capacitor 27 with another plate of the capacitor 27 formed by the conductive metal surface 14 of the external housing 12 of the utility meter 11. The plate 26 is fixed in position within the remote module housing 25.

Basically, the utility meter 11 provides data on (not shown on FIG. 1) indicating the usage of the utility being measured by the meter 11. The remote meter electronics 21 utilizes internal transmitter circuitry to provide an excitation signal to the antenna 23 for remote transmission of this data in some suitable form to a meter collecting station at a remote station. It is significant to note that the transmitter antenna system must be very efficient since the remote meter electronics and transmitter are preferably operated with a small battery that is expected to provide the required power for more than ten years. Also for practical implementation reasons the transmitter antenna must be small and its length is much shorter than the ideal 0.25 wavelength which would be 16 inches for 184 MHz operation. A significant feature of the utility meter assembly 10 is that the required antenna radiation power efficiency for the transmission of the data for relative low frequencies (184 MHz) can be achieved and implemented by utilizing the meter housing 12 and surface 14 as a ground plane extension or counterpoise for the antenna system. This increases the effective length of the antenna and thus increases its efficiency. In other words, typically the antenna 23 for maximum efficiency in wireless data transmission should be ¼ wave length of the transmission carrier frequency. However, for low frequency transmissions such as 184 MHz, this would result in an extremely long (16 inches) antenna 23. The utility meter 11 avoids this requirement by capacitively coupling one end of the antenna 23 due to forming an essentially parallel plate capacitor 27 by the plate 26 within the remote module 20 and the capacitor plate formed by the top surface 14 of the utility meter external housing 12. This substantially (by more than 20%) alters the effective electrical length of antenna 23 and permits the use of a much smaller length dimension (5 inches) for the antenna 23, while still having the antenna act as a ¼ wavelength at the relatively low transmission frequency of 184 MHz.

As was stated previously, it is desirable to have a mounting apparatus for the remote meter reading module 20 such that the module can be mounted to any sort of meter with substantially different shoulder to top surface dimensions 19. This is accomplished in the following manner.

The housing 25 of the remote meter reading module 20 has a plurality of foot projections 30 which are in contact with the utility meter 11 and determine a spacing 31, best shown in FIG. 7, between the conductive plate 26 of the remote meter reading module 20 and the top conductive surface 14 of the utility meter 11. This spacing 31 also corresponds therefore to the spacing between the capacitor plates which form the capacitor 27 generally indicated in FIG. 4. The preferred mounting apparatus described herein tends to insure the consistency of this dimension 31 regardless of the actual shoulder (17, 18) to top surface 14 dimension 19 and this is achieved in the following manner.

Figure 5:
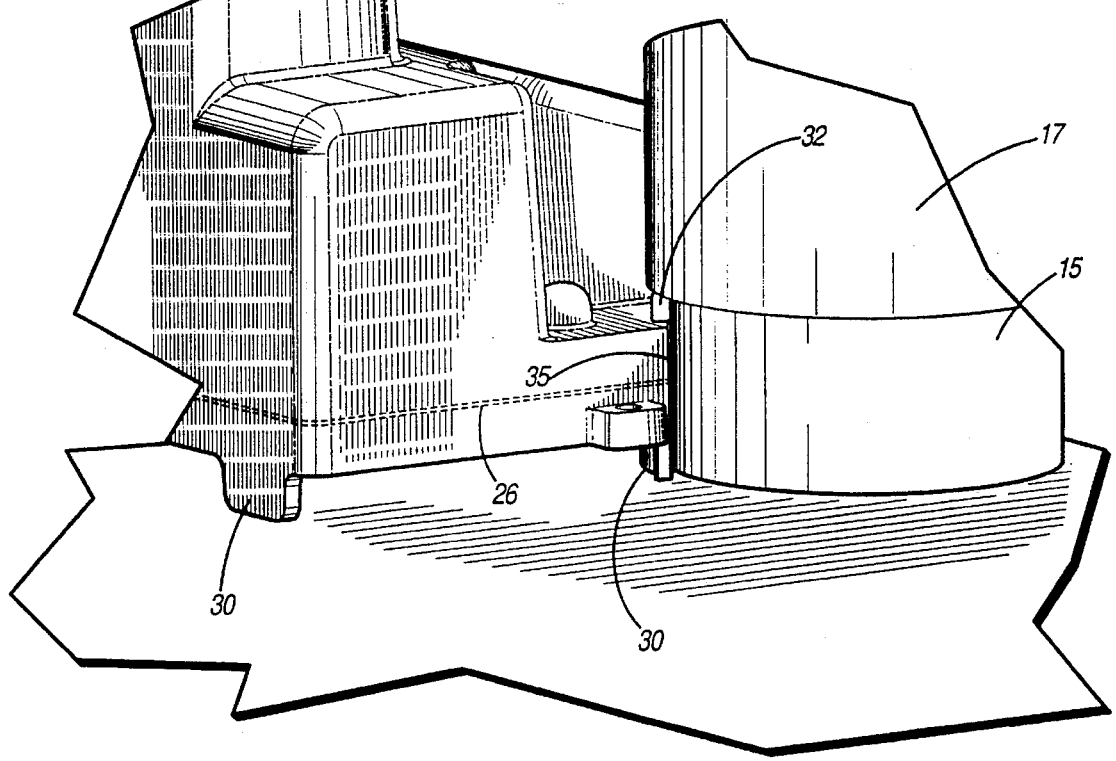
FIG. 5 is a perspective view of a portion of the utility meter assembly shown in FIG. 1.
Figure 6:
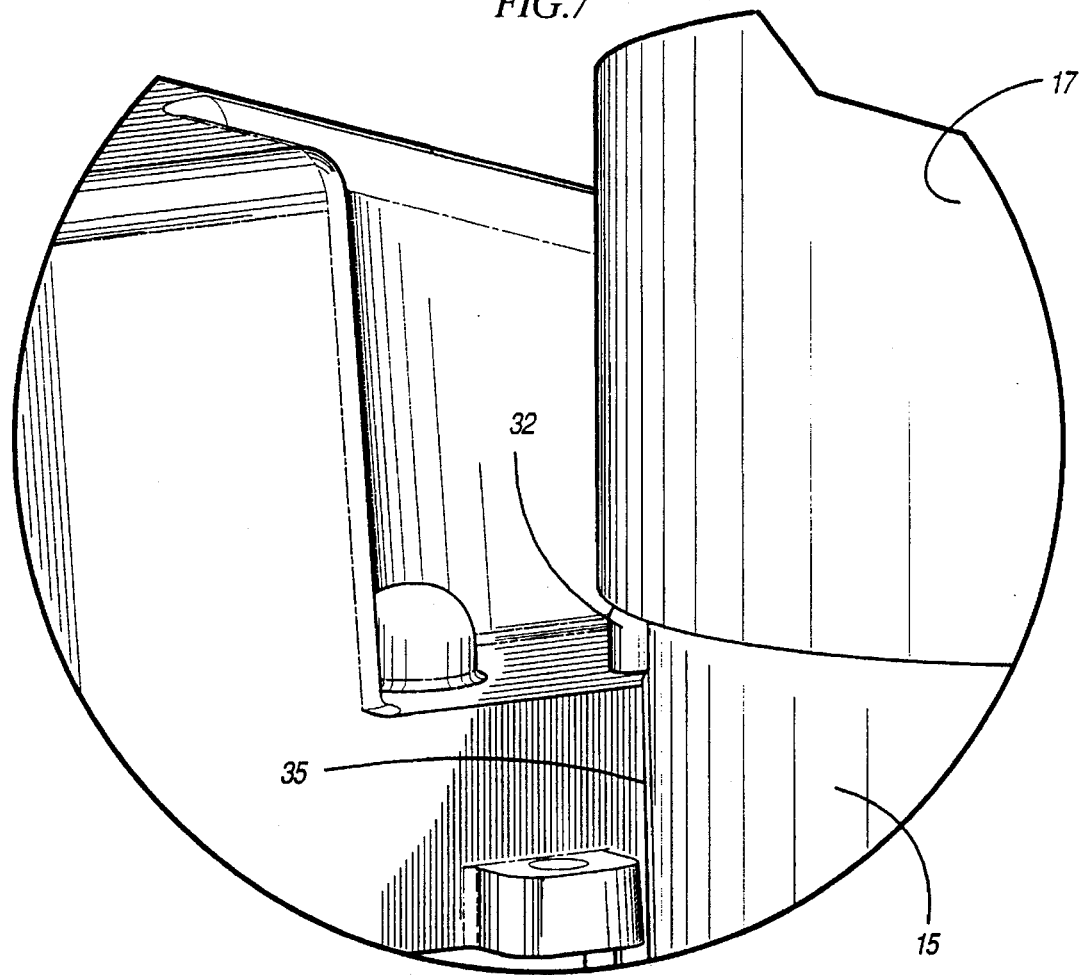
FIG. 6 is an enlarged perspective view of a portion of FIG. 5.

The module housing 25 includes what amounts to biasing means that biases the foot projections 30 towards an into contact with the conductive surface 14 of the utility meter 11. More specifically, this biasing means comprises flexible plastic upstanding pin projections 32 which are integral with the plastic housing 25 of the remote meter reading module 20. These flexible pin projections 32, shown in FIGS. 1, 5 and 6, provide a biasing means to seat the housing 25 against the housing 12 of the utility meter. This is because the upstanding dimension of the pins 32 is such that when they fit under the shoulders 17 and 18 and the dimension 19 is at its maximum a snug press fit is achieved. For utility meters where the dimension 19 is less, the pins 32, being flexible, will be compressed during insertion of the meter housing 25 onto the posts 15 and 16. For a minimum dimension of the spacing 19, the flexible pins 32 may be essentially flattened or sheered off, but the remaining portion of the housing 25 will then snugly fit within this minimum dimension 19 and force the foot projections 30 of the housing 25 into contact with the top surface 14 of the utility meter 11. This is accomplished since the mounting posts 15 and 16 and the shoulders 17 and 18 represent rigid projections from the top surface 14 of the utility meter. The posts 15 and 16 comprise cylindrical posts that extend from a main, substantially rectangular box shaped, three dimensional shaped main body 33 of the utility meter housing 12. In this manner, the spacing 31 is controlled such that a precise spacing is provided so as to provide the same amount of capacitive coupling to the antenna 23 regardless of the different dimensions 19 for different types of utility meters.

Figure 2:
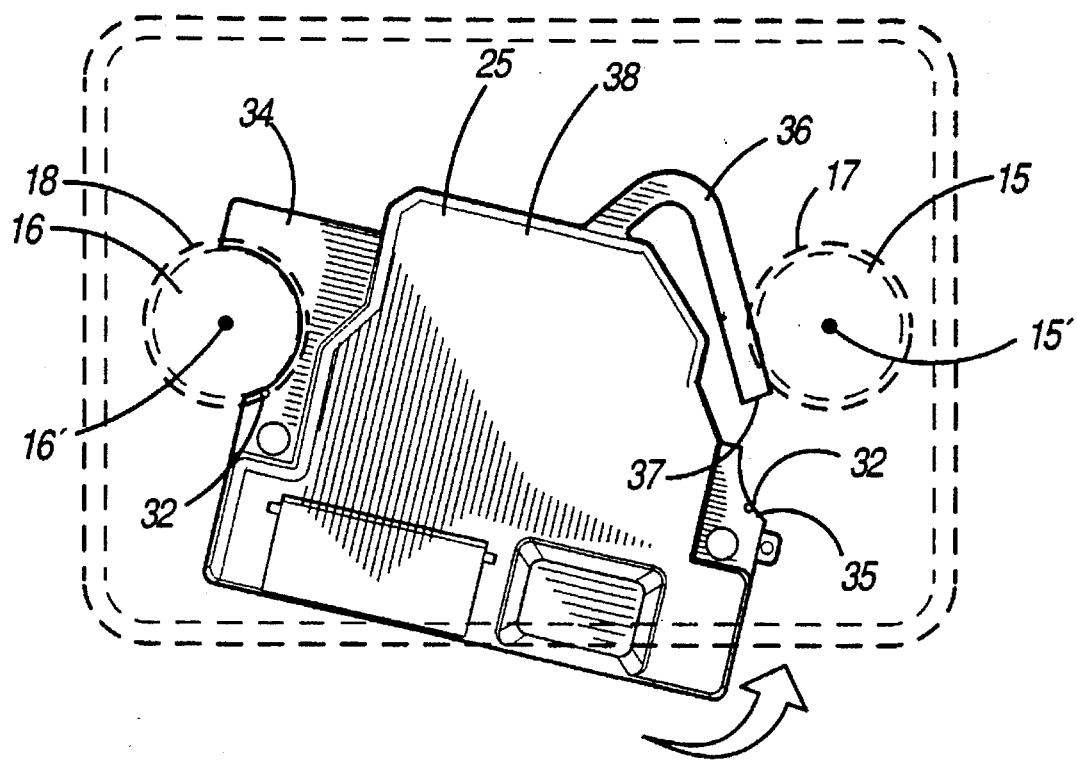
FIGS. 2 and 3 are top views of the assembly shown in FIG. 1 illustrating the sequential positioning of a remote module onto two upstanding mounting posts (inlet pipe and outlet pipe connections) of a utility meter.
Figure 3:
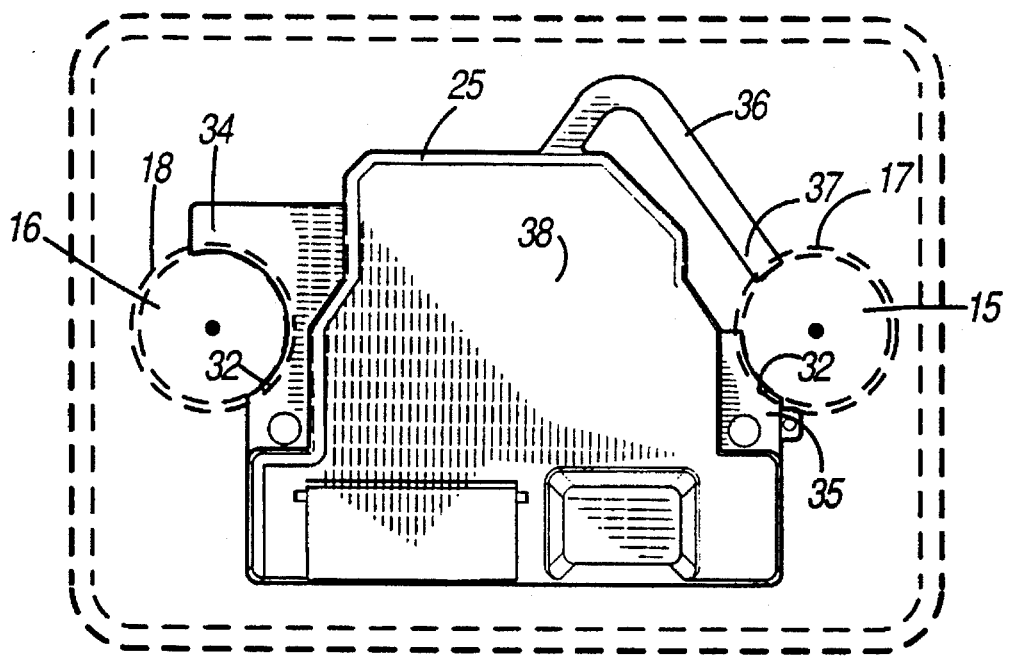

The plastic housing 25 of the remote meter reading module 20 includes a first peripheral partially arcuate portion 34 and a second peripheral partially arcuate portion 35. At least one pin 32 is provided on each of the arcuate portions 34 and 35. These arcuate portions are best illustrated in FIGS. 1–3. In addition, the remote meter reading module housing 25 has a flexible arm extension 36 with a free end 37 of the flexible arm extension 36 positioned adjacent the second arcuate portion 35. The flexible arm extension 36 extends outward from a main body 38 of the remote meter reading housing 25, and the free end portion 37 is normally spaced away from the main body 38 as shown in FIG. 3, but is deflectable toward the main body 38 as shown in FIG. 2. Both the flexible pins 32 and the flexible arm extension 36 are molded plastic portions of the molded plastic housing 25. FIGS. 2 and 3 illustrate the sequential pivotal insertion (about axis 16') of the housing 25 onto the mounting posts 15 and 16 which, along with shoulders 17 and 18, are shown in phantom in FIGS. 2 and 3. A review of FIGS. 2 and 3 illustrate that the configuration for the plastic molding housing 25 has provided an easily insertable plastic snap on retaining mechanism for mounting the housing 25 to the mounting posts 15 and 16. It should be noted that the axes 15' and 16' are normal to the ground plane plate 26 and are positioned beyond the remote module housing 25. Also, the arcuate portions 34 and 35 form part of a circular path about the axes 16' and 15', respectively, and the free end portion 37 is normally positioned along the circular path formed about axis 15'.

From the preceding description it is apparent that an improved utility meter assembly and remote module have been provided in which relatively low frequency operation is permissible due to effective lengthening of the electrical length of a transmission antenna and wherein the assembly and module can be used with meters having various actual sizes for the shoulder to meter dimensions 19. In addition, an easy to assemble snap on assembly for attaching a remote meter housing to a pair of mounting posts, preferably for creating a utility meter assembly, has also been provided wherein such a configuration is usable for mounting a module housing to any pair of upstanding posts. This is implemented with no additional mounting hardware and with a minimum amount of installation effort. While we have shown and described specific embodiments of the invention, further modifications and improvements will occur to those skilled in the art. All such modifications which retain the basic underlying principles disclosed and claimed herein are within the scope of this invention.

We claim:

1. Utility meter assembly comprising:

at least one utility meter having measuring apparatus for measuring use of a utility, said measuring apparatus positioned within an external housing having at least one conductive metal surface; and a remote meter reading module positioned outside of and mounted adjacent to said utility meter external housing and electrically connected to said measuring apparatus, said remote meter reading module having a transmitter and an antenna for wireless transmission of meter data developed in accordance with data provided by said measuring apparatus, wherein one end of said antenna is electrically connected to a conductive ground plane plate within said remote meter reading module, said conductive ground plane plate forming one plate of a capacitor with said conductive metal surface of said utility meter external housing forming another plate of said capacitor, said capacitor plates being spaced apart and capacitively coupling said antenna to said meter housing and thereby substantially altering the effective electrical length of said antenna, and improving the radiation power efficiency by using the meter housing as a ground extension.

2. Utility meter assembly according to claim 1 wherein said remote meter reading module has a housing with foot projections thereof in contact with said utility meter external housing, said foot projections determining the spacing between said capacitor plates by determining the spacing between said conductive metal surface of said utility meter external housing and said conductive ground plane plate of said remote meter reading module.

3. Utility meter assembly according to claim 2 wherein said remote meter reading module housing includes bias means for biasing said foot projections into contact with said utility meter external housing.

4. Utility meter assembly according to claim 3 wherein said remote meter reading module housing is primarily molded plastic.

5. Utility meter assembly according to claim 3 wherein said bias means comprises flexible portions of said remote meter reading module housing which cooperate with rigid projections extending from said utility meter external housing to bias said foot against said utility meter external housing.

6. Utility meter assembly according to claim 5 wherein said remote meter reading module housing is primarily molded plastic and said bias means comprises flexible plastic pin projections formed integral with said remote meter reading module housing.

7. Utility meter assembly according to claim 6 wherein said rigid projections comprise a pair of upstanding cylindrical posts extending from a main body of said utility meter external housing, each of said cylindrical posts having integral annular shoulders at a spacing above said utility meter external housing main body, said annular shoulders being in contact with said plastic pins to form said bias means.

8. Utility meter assembly according to claim 7 wherein said remote meter reading module housing has first and second portions which, together with said cylindrical posts, provide a snap on assembly for mounting said module housing to said cylindrical posts.

9. Utility meter assembly according to claim 8 wherein said first and second portions of said remote meter reading module housing each have partial arcuate portions in contact with said cylindrical posts and wherein said remote meter reading module housing includes a flexible retaining arm extending therefrom and having a free end in contact with one of said cylindrical posts.

10. Utility meter assembly according to claim 9 wherein said cylindrical posts are spaced apart by a predetermined dimension with said arcuate portions of said remote meter reading module housing positioned between said cylindrical posts, said arcuate portions being positioned between said annular shoulders on said cylindrical posts and said main body of said utility meter external housing.

11. Remote module usable for attachment to a utility meter comprising:

a remote meter reading module to be positioned outside of and mounted adjacent to a utility meter external housing and electrically connected to said utility meter, said remote meter reading module having a transmitter and an antenna for wireless transmission of meter data developed in accordance with data to be received by said module from said utility meter, wherein one end of said antenna is electrically connected to a conductive ground plane plate within said remote meter reading module, said conductive ground plane plate forming one plate of a capacitor for capacitively coupling to the meter housing and thereby substantially altering the effective electrical length of said antenna.

12. Remote module according to claim 11 wherein said remote meter reading module has a housing with foot projections thereof to be positioned in contact with said utility meter.

13. Remote module according to claim 12 wherein said remote meter reading module housing includes bias means for biasing said foot projections into contact with said utility meter, and wherein said remote meter reading module housing is primarily molded plastic and said bias means comprises flexible plastic pin projections formed integral with said remote meter reading module housing.

14. Remote module according to claim 13 wherein first and second peripheral portions of said remote meter reading module housing each have partial arcuate portions and wherein said remote meter reading module housing includes a flexible retaining arm extending therefrom and having a free end.

15. Remote module according to claim 14 wherein each of said arcuate portions of said remote meter reading housing form a portion of a circular path centered about an axis normal to said ground plane plate with said axes being spaced apart at a predetermined dimension and positioned such that said axes are spaced away from said remote meter reading housing, and wherein said free end of said flexible arm extension is generally positioned, in its normal position, along the circular path formed about one of said axis with said actuate portion defining a portion of that circular path.

16. Remote module mounting apparatus usable for attachment of a module to a utility meter, comprising:

a module housing, with a main housing body having electronics therein, for mounting to two meter posts, said module housing having a first peripheral portion thereof having a partial arcuate shape and a second peripheral portion having a partial arcuate shape, said module housing also having a flexible arm extension with a free end of said flexible arm extension adjacent said second arcuate portion, said free arm normally spaced away from said main housing body but deflectable toward said main housing body.

17. Remote module mounting apparatus according to claim 16 wherein said main housing body comprises mainly molded plastic and wherein said arcuate portions and said flexible arm extension are molded plastic.

18. Remote module mounting apparatus according to claim 17 wherein said main housing body includes at least one flexible pin adjacent and extending from each of said arcuate portions.

19. Remote module mounting apparatus according to claim 18 wherein each of said arcuate portions generally form a portion of a circular path centered about an axis with said axes being spaced apart at a predetermined dimension and are positioned such that said axes are spaced away from said module housing, and wherein said free end of said flexible arm extension is generally positioned, in its normal position, along the circular path formed about one of said axis with said arcuate portion defining a portion of that circular path.

20. Remote module mounting assembly comprising:

a module housing with a main housing body having electronics therein;

two upstanding posts to which said main housing body is to be attached, wherein said posts each have a cylindrical axis and wherein the cylindrical axes are spaced apart by a predetermined dimension and are positioned such that said axes are spaced away from said module housing;

the main housing body having a first peripheral portion thereof having a partial arcuate shape and a second peripheral portion having a partial arcuate shape, said main housing body also having a flexible arm extension with a free end of said arm positioned adjacent said second arctuate portion, said free arm normally spaced away from said main housing body but deflectable toward said main housing body;

each of said arctuate portions in contact with an associated one of said posts with said free end of said flexible arm extension also in contact with one of said posts.

21. Remote module mounting assembly according to claim 20 wherein flexible pins are positioned on said main housing body adjacent each of said arcuate portions.

22. Remote module mounting assembly according to claim 21 wherein each of said posts has an annular shoulder formed thereabout with said flexible pins contacting said annular shoulders.

23. Remote module mounting assembly according to claim 22 wherein said main housing body comprises mainly molded plastic material and wherein said flexible arm extension and said flexible pins comprise said molded plastic material and are integral with said main housing body.

* * * * *